(12) United States Patent
Xavier et al.

(10) Patent No.: US 10,425,042 B2
(45) Date of Patent: Sep. 24, 2019

(54) NEGATIVE CAPACITANCE CIRCUITS INCLUDING TEMPERATURE-COMPENSATION BIASINGS

(71) Applicant: TEXAS INSTRUMENTS INCORPORATED, Dallas, TX (US)

(72) Inventors: Ani Xavier, Kottayam (IN); Neeraj Shrivastava, Bangalore (IN); Arun Mohan, Bangalore (IN); Shagun Dusad, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/859,431

(22) Filed: Dec. 30, 2017

(65) Prior Publication Data
US 2019/0207564 A1    Jul. 4, 2019

(51) Int. Cl.
*H03F 3/45* (2006.01)
*H03F 1/30* (2006.01)
*H03F 1/02* (2006.01)

(52) U.S. Cl.
CPC ........... *H03F 1/301* (2013.01); *H03F 1/0205* (2013.01); *H03F 3/45179* (2013.01); *H03F 2203/45286* (2013.01)

(58) Field of Classification Search
CPC .... H03F 1/301; H03F 1/0205; H03F 3/45179; H03F 2203/45286
USPC ................................. 330/252, 253, 254, 261
See application file for complete search history.

(56) References Cited

PUBLICATIONS

Jungwon et al. "A Low-Power Gigabit CMOS Limiting Amplifier Using Negative Impedance Compensation and its Application" IEEE, pp. 393-399, Mar. 2012 (Year: 2012).*

* cited by examiner

*Primary Examiner* — Khanh V Nguyen
*Assistant Examiner* — Khiem D Nguyen
(74) *Attorney, Agent, or Firm* — John R. Pessetto; Charles A. Brill; Frank D. Cimino

(57) ABSTRACT

In some examples, an amplifier stage includes a voltage-gain amplifier stage and a negative capacitance circuit coupled to the voltage-gain amplifier stage, the negative capacitance circuit comprising a first transistor that provides a first temperature-biased current.

6 Claims, 2 Drawing Sheets

NEGATIVE CAPACITANCE CIRCUITS INCLUDING TEMPERATURE-COMPENSATION BIASINGS

BACKGROUND

A multiplying digital to analog converter (MDAC) may combine the functions of a sample and hold circuit, subtraction circuit, digital-to-analog circuit, and gain circuit into a single switched capacitor circuit. Typically, a pipelined analog to digital converter (pipeline ADC) employs many such MDAC stages to convert analog signals to digital signals.

SUMMARY

In at least some examples, an amplifier stage includes a voltage-gain amplifier stage and a negative capacitance circuit coupled to the voltage-gain amplifier stage, the negative capacitance circuit comprising a first transistor that provides a first temperature-biased current.

In another example, a system includes a voltage-gain amplifier stage, which further includes a first transistor comprising a first gate, a first source, and a first drain. The voltage-gain amplifier stage also includes a second transistor comprising a second gate, a second source, and a second drain, wherein the first and the second gates are coupled to each other, and wherein the first and second drains are coupled to each other and to a first voltage supply. The voltage-gain amplifier stage also includes a third transistor comprising a third gate, a third source, and a third drain. The voltage-gain amplifier stage also includes a fourth transistor comprising a fourth gate, a fourth source, and a fourth drain, wherein the third drain is coupled to the first source at a first output node and the fourth drain is coupled to the second source at a second output node. The voltage-gain amplifier stage also includes a fifth transistor having a fifth gate, a fifth source, and a fifth drain, wherein the fifth source is coupled to a ground terminal and the fifth drain is coupled to the third and the fourth sources, wherein the fifth transistor provides a first temperature-biased current. The system also includes a negative capacitance circuit, which includes a constant current source. The negative capacitance circuit further includes a sixth transistor comprising a sixth gate, a sixth source, and a sixth drain. The negative capacitance circuit further includes a seventh transistor comprising a seventh gate, a seventh source, and a seventh drain, wherein the seventh drain is coupled to the second output node and the sixth drain is coupled to the first output nod. The negative capacitance circuit further includes a negative capacitor coupled to the sixth and seventh sources.

In yet another example, a system includes a voltage-gain amplifier stage, which includes a first input differential transistor pair. The voltage-gain amplifier stage includes a first output differential transistor pair coupled to the first input differential transistor pair at a first output node and a second output node. The voltage-gain amplifier stage also includes a first transistor that provides a first temperature-biased current, wherein the first transistor couples to the first input differential transistor pair. The system also includes a modified negative capacitance circuit, which further includes a third differential transistor pair and a second transistor that provides a second temperature-biased current, wherein the second transistor couples to the third differential transistor pair.

BRIEF DESCRIPTION OF THE DRAWINGS

For a detailed description of various examples, reference will now be made to the accompanying drawings in which.

DETAILED DESCRIPTION

Figure 1:
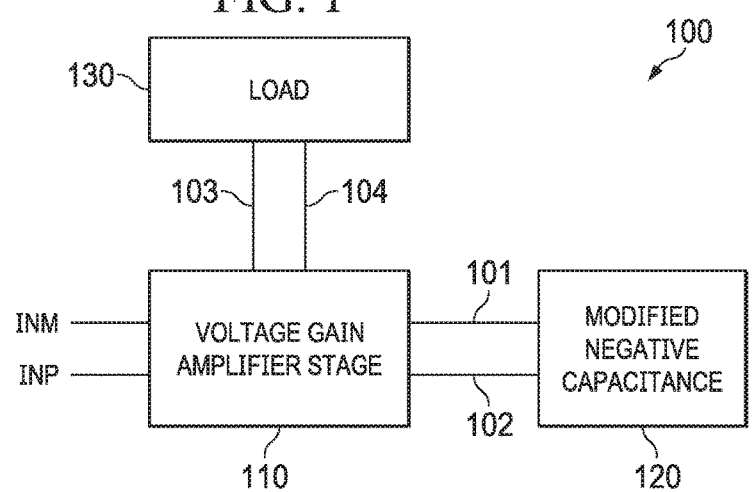
FIG. 1 is a block diagram of an illustrative pre-amplifier stage, in accordance with various examples.

In a pipeline ADC, an input signal traverses through multiple stages. In some cases, one or more stages may require the input signal to be amplified before it is processed. This amplification function is sometimes referred to as "pre-amplification," i.e., the input signal is amplified before it is processed by one of the MDAC stages. In some cases, a closed-loop pre-amplifier may be used. However, a closed-loop pre-amplifier may need more power to perform its closed-loop functions than other types of amplifiers. Therefore, in some cases, an open-loop pre-amplifier that utilizes relatively low power may be preferred. In some cases, an open-loop pre-amplifier may include a voltage-gain amplifier. A voltage-gain amplifier may further include a transconductance amplifier comprising a transconductance stage that converts a voltage input signal into a current output signal in such a manner that the transconductance amplifier presents high input impedance to the voltage input and a low output impedance to the load. An input voltage to output current conversion through a transconductance amplifier is referred to as the amplifier's transconductance.

In some cases, the input stage of a voltage-gain amplifier includes a pair of input transistors (forming the transconductance amplifier) and the output stage of the voltage-gain amplifier includes a pair of output transistors. In such a case, the gain of the voltage-gain amplifier may be calculated by dividing the input transconductance to the output transconductance, as shown in equation 1, where Gm (input) refers to the transconductance of the input stage (input transconductance) and Gm (output) refers to the transconductance of the output stage (output transconductance).

$$\text{Gain}=Gm(\text{input})/Gm(\text{output}) \quad (1)$$

Typically, high and/or substantially constant gain in a voltage-gain amplifier is desired. However, in some cases, there may be a temperature variation in or around the die in which the voltage-gain amplifier is fabricated. Due to the temperature variation, the gain of the transconductance amplifier may vary. The gain may vary because of the difference in variation of the input and output transconductance of the input and output transistors, respectively. Stated another way, the input and the output transconductances may not vary with temperature in the same manner. In order to prevent gain variation due to temperature variation (and, in turn, transconductance variation), a temperature compensation technique may be used. In some cases, the transconductance amplifier may be biased with one or more temperature-dependent (or, in some cases, temperature-independent) current sources. The temperature-dependent (or temperature-biased) current sources may generate a biasing current proportional to the increase in temperature. In some cases, temperature-dependent current sources may generate the biasing current that is inversely proportional to the increase in temperature. In other cases, both temperature-dependent and temperature-independent current sources may be used. The temperature compensation biasing technique, as further described below, may facilitate the provision of a substantially constant gain (by providing biasing current with a temperature change) across the temperature range at which the die may operate.

A frequency response of a voltage-gain amplifier may be defined as the gain of an amplifier that can be achieved across a range of frequencies. The bandwidth of an amplifier is defined as the frequency at which the gain of the amplifier drops from its max gain value (or called low frequency gain or DC gain) to a gain value that is approximately 70% of the maximum gain value. In some cases, the bandwidth of an amplifier may be computed using equation 2, where BW(amp) (in radians/sec) refers to the bandwidth of an amplifier and C(load) refers to the capacitance of the load capacitor that may be the representation of the load coupled to the output stage of the voltage-gain amplifier.

$$BW(amp)=Gm(output)/C(load) \qquad (2)$$

As noted above, the bandwidth may be limited by the load (or the load capacitor) coupled to an amplifier. In some cases, the load may increase. Since the bandwidth is inversely proportional to the load capacitance (or directly proportional to the output transconductance), in such a scenario, the output transconductance may increase which, in turn, increases the output current of the amplifier. A low output current (or low amplifier power) from an amplifier is typically desired. In order to prevent the increase in amplifier power due to the increased output current, in some cases, a capacitor is coupled to the output of the transconductance amplifier such that the effective capacitance seen by the amplifier is reduced. This additional capacitance is sometimes referred to as "negative capacitance" generated by a "negative capacitor" coupled in a negative capacitance circuitry. The negative capacitance permits extending the bandwidth of the transconductance amplifier without substantially increasing the output current. This may be expressed using equation 3, where BW(neg) is the bandwidth of the amplifier with a negative capacitor circuit coupled to it, and C(neg) is the negative capacitance introduced by the negative capacitor.

$$BW(neg)=Gm(output)/(C(load)-C(neg)) \qquad (3)$$

Further, the bandwidth of the negative capacitance circuitry (BW(negc)) may be given by equation 4.

$$BW(negc)=Gm(output_{negc})/C(neg) \qquad (4)$$

However, variation between the bandwidth of the negative capacitance circuitry and the amplifier with temperature may cause additional performance related issues. In some cases, at extreme temperatures (e.g., 0 C) the transconductance amplifier including negative capacitor and/or temperature-compensated biasing may result in frequency peaking (sometimes referred to as gain peaking, i.e., sudden increase in gain at certain frequencies). From extensive testing, it is observed that frequency peaking may occur when the BW(negc) of equation 4 is less than or equal to the BW(neg) of equation 3. Stated another way, frequency peaking may occur because the BW(negc) of the negative capacitor circuitry may not efficiently track the BW(neg) of the amplifier. Frequency peaking typically occurs at high frequencies (e.g., tens of Gigahertz) and may lead to output signal distortion. This effect may be enhanced at lower temperatures. Therefore, a solution is desired that can mitigate the issue of frequency peaking.

Accordingly, at least some of the examples in this disclosure are directed to a pre-amplifier stage that includes a voltage-gain amplifier that includes a temperature compensation circuit that is configured to provide biasing current with an increase in temperature. In particular, the voltage-gain amplifier includes a negative capacitor circuit that is configured to provide a temperature compensation bias, i.e., the temperature compensated bias provides an increased current (relative to a substantially constant current) as the temperature decreases, and the temperature compensated bias provides a reduced current (relative to a constant current) as the temperature increases. Additionally, this negative temperature compensated biasing in the modified negative capacitance circuit may result in BW(negc) being greater than or equal to BW(neg) at operating temperature conditions, which may further prevent frequency peaking.

FIG. 1 is a block diagram of an illustrative pre-amplifier stage 100 that may be used in pipeline ADCs. In some examples, the pre-amplifier stage 100 may be implemented in circuits other than pipeline ADCs. The pre-amplifier stage 100 includes a voltage-gain amplifier stage 110 coupled to a modified negative capacitance circuit 120 (or negative capacitance circuit 120) through connections 101, 102. The pre-amplifier stage 110 and/or modified negative capacitance circuit 120 may include a plurality of n-type metal oxide semiconductor transistor (NMOS) transistors (shown in FIG. 2 and described below) arranged in a differential configuration. While the voltage-gain amplifier stage 110 is illustrated as receiving a pair of inputs INM and INP, in practice the voltage-gain amplifier stage 110 may receive any number of pairs of inputs. In some examples, a number of input pairs to the voltage-gain amplifier stage 110 may be at least partially determined based on a number of NMOS transistor pairs present in the voltage-gain amplifier stage 110.

In some examples, the pre-amplifier stage 100 further includes a load 130 coupled to the voltage-gain amplifier stage 110 through the connections 103, 104. In some examples, the load 130 may be illustrated as load capacitors (shown in FIG. 2 and described below). As further described below, the connections 101, 102, 103, and 104 are made such that the modified negative capacitance circuit 120 reduces the effective load capacitance of the load 130 by a capacitance value. This negative capacitance value may be provided by a capacitor included in the negative capacitance circuit 120. As noted above, at extreme temperatures (e.g., 0 C) and frequencies, an amplifier including a negative capacitor and/or temperature-compensated biasing may experience frequency peaking. However, to prevent frequency peaking at high frequencies, the bandwidth of the modified negative capacitance circuit 120 may be greater than the bandwidth of the voltage-gain amplifier stage 110. To ensure such a state exists, temperature-dependent biasing (or temperature-biased current) is provided at the modified negative capacitance 120, which may lead to a frequency response that is devoid of peaking.

Figure 2:
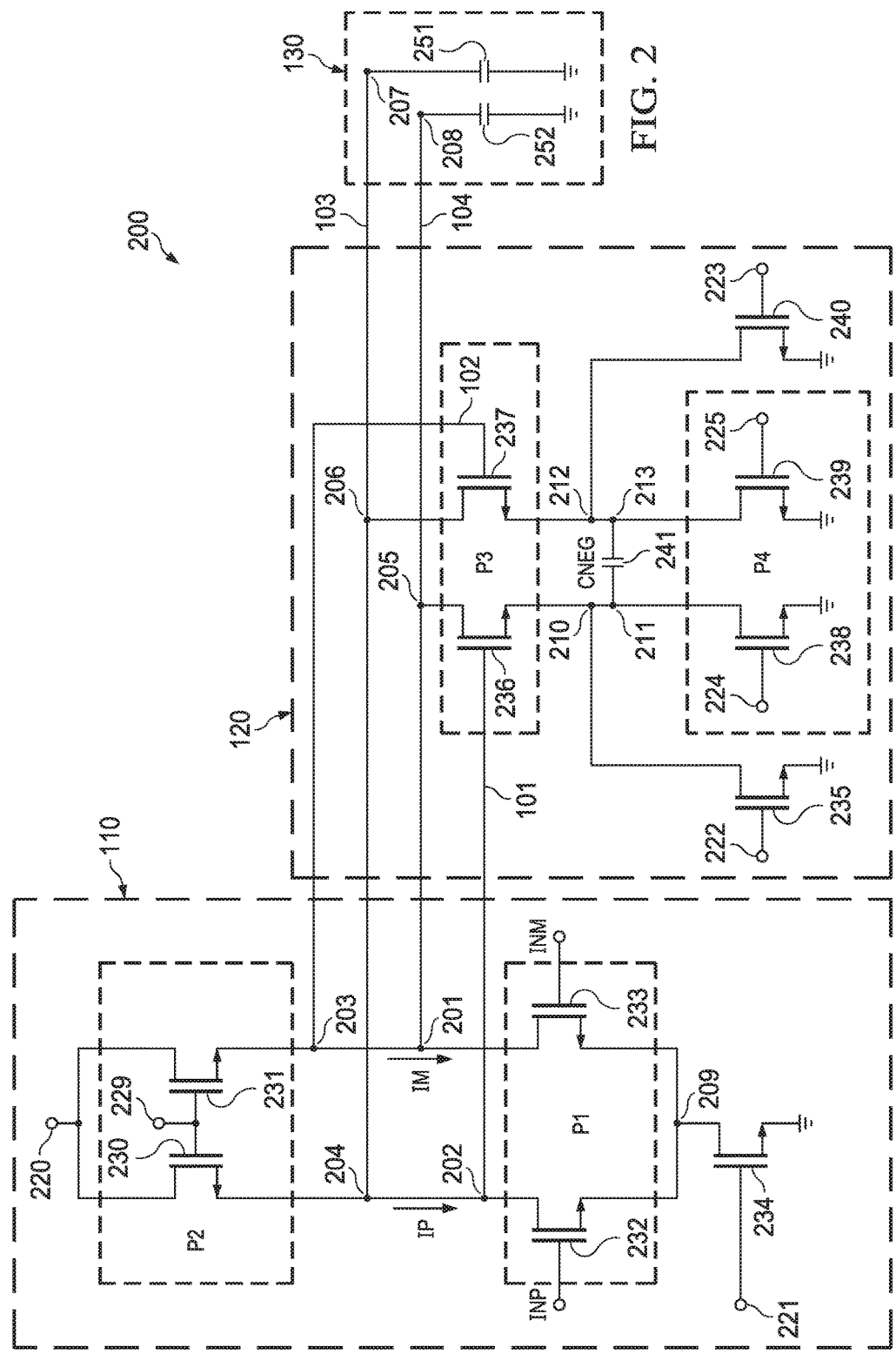
FIG. 2 is a detailed schematic diagram of an illustrative pre-amplifier stage, in accordance with various examples.

FIG. 2 is an illustrative circuit schematic diagram 200 of the pre-amplifier stage 100. The example depicted in FIG. 2 is merely illustrative of the pre-amplifier stage 100 and does not limit the range of examples for the pre-amplifier stage 100. In some examples, the voltage-gain amplifier stage 110 includes an NMOS transistor pair P1 (including NMOS transistors 232, 233) that forms a transconductance amplifier. The NMOS transistor pair P1 may also be referred to as input transistors, since they are controlled by input signals INP, INM. The voltage-gain amplifier stage 110 may also include an NMOS transistor pair P2 (including NMOS transistors 230, 231), which may also be referred to as the output transistors. In some examples, the NMOS transistor pair P1 may be a differential pair, i.e., the NMOS transistors 232 and 233 receive a pair of balanced differential signals INM and INP at their gates (respectively). In some examples, balanced differential signals may include signals with the same amplitude, but with different phase. In some examples, the NMOS transistors 230, 231 may act as output transistors and receive equal current from each of the NMOS transistors 232, 233 (respectively). In some examples, the voltage-gain amplifier stage 110 may include another pair of NMOS transistors (not expressly depicted), similar to the NMOS transistor pair P1, for receiving an additional differential input (similar to INP and INM). In such examples, a second current source may be needed to drive the second NMOS transistor pair.

The gate terminals of the NMOS transistors 230, 231 are coupled to each other and to a node 229 configured to provide a gate voltage, which may be controllable using an external circuitry (not expressly shown.) In some examples, the gate voltage provided to the node 229 is substantially equal to the source potential of the NMOS transistors 230, 231. Similarly, the drain terminals of the NMOS transistors 230, 231 are coupled to each other, and they are further configured to receive a supply voltage VDD through the node 220. The source terminals of the NMOS transistors 230, 231 are coupled to the drain terminals of the NMOS transistors 232, 233 (respectively). In some examples, the source terminals of NMOS transistors 232, 233 may couple at a node 209. The node 209 may further be coupled to a drain of an NMOS transistor 234. The source of the NMOS transistor 234 may be coupled to ground. In some examples, the gate of the NMOS transistor 234 is configured to receive a bias voltage at a node 221. In some examples, the NMOS transistor 234 may act as a current source to the pair of NMOS transistors 232, 233. In some examples, the NMOS transistor 234 may receive a gate signal such that the NMOS transistor 234 generates a temperature-dependent signal (e.g., a temperature-biased current), such as a "proportional to absolute temperature," or PTAT signal. The PTAT signal (or current) increases with an increased temperature. Stated another way, the PTAT signal may, at least in part, be a function of the temperature so that as the temperature increases, the temperature-dependent signal also increases, which may increase the current that the NMOS transistor 234 injects to the node 209, which may further provide the PTAT current at the NMOS transistors 230, 231 at their output nodes 204, 201, respectively. Due to the position of the nodes 204, 202, they both are interchangeably used in this disclosure. Similarly, the nodes 203, 201 are also interchangeably used. A load capacitor 251 couples to the output node 204 and a load capacitor 252 couple to the output node 201.

As noted above, the NMOS transistors 232, 233 may receive a balanced signal; for example, the NMOS transistor 232 may receive an INP signal at its gate terminal and the NMOS transistor 233 may receive an INM signal at its gate terminal, with the INP and INM signals having the same amplitude but different phases. Variations in the illustrative voltage signals INM and INP may introduce changes in the drain currents IP and IM of the NMOS transistors 232, 233, respectively. Assume that gm(232,233) denotes the transconductance of the NMOS transistors 232 and 233. The amount of current difference between the NMOS transistors 232, 233 may be given by equation 5:

$$IM-IP=gm(232,233)*(INP-INM) \quad (5)$$

In operation, as the INP, INM signals are received by the NMOS transistors 232, 233, a differential signal current $I_{DIFF}$ is produced that may be equal to IP-IM. As noted in equation 5, $I_{DIFF}$ may also be represented by gm(232,233) *(INP−INM). The $I_{DIFF}$ current may build up and flow into the NMOS transistors 230, 231 (output transistors), the capacitors 251, 252, and the modified negative capacitance circuit 120. Once the capacitors 251, 252 are charged and act as an open circuit, the current $I_{DIFF}$ flows into the NMOS transistors 230, 231. The current $I_{DIFF}$ flowing through the NMOS transistors 230, 231 provides the output voltage Vout that may be equal to $I_{DIFF}$/gm(230, 231). This condition may be referred to as a steady state condition and the voltage gain of the amplifier stage 110 in this condition is defined as Vout/(INP−INM)=−gm(232, 233)/gm(230, 231). The voltage Vout may be such that a voltage OUTP is present at the node 204 and a voltage OUTM is present at the node 201. This steady state gain may be determined by the transconductance of NMOS transistors 232, 233 (input transistors) and NMOS transistors 230, 231 (output transistor) that may be temperature compensated by using a bias current (as described above) to the NMOS transistors 232, 233 as PTAT current. The PTAT current is flowed through transistors 232, 233 by the NMOS transistor 234. Since the bias current flowing into the NMOS transistors 230, 231 from the NMOS transistors 232, 233 is PTAT in nature, there is a need to flow a balanced current (also referred to as an NTAT (Negative to Absolute Temperature) current) into nodes 204, 201 in order to have a substantially constant current at the output nodes 204, 201. The NTAT is opposite in nature to PTAT, because in case of NTAT, the current increases as temperature reduces. The modified negative capacitance circuit 120 may include an NMOS transistor pair P3 (including NMOS transistors 236, 237), and an NMOS transistor pair P4 (including NMOS transistors 238, 239). In some examples, the modified negative capacitance circuit 120 also includes a negative capacitor CNEG 241 that is coupled to nodes 211, 213. The sources of the NMOS transistors 236, 237 may couple to the drains of the NMOS transistors 238, 239 (respectively). As noted above, the capacitor 241 reduces the effective capacitance experienced by the voltage-gain amplifier stage 110. The sources of the NMOS transistors 238, 239 may couple to ground. The circuit 120 may also include a pair of NMOS transistors 235, 240 that are controlled by a gate signal provided at the nodes 222, 223 such that the NMOS transistors 235, 240 generate temperature-dependent signal that may be NTAT in nature. The sources of the NMOS transistors 235, 240 may couple to ground and the drains of the NMOS transistors may couple to the nodes 210, 212 (respectively). Per the equation 4, the bandwidth of the negative capacitance circuitry (BW (negc)) may be given by equation 6

$$BW(negc)=Gm(236,237)/C(neg) \quad (6)$$

In some examples, the NMOS transistor 236, at its gate terminal, is configured to receive the output voltage OUTP of the NMOS transistor 232 via the connection 101 and the NMOS transistor 237, at its gate terminal, is configured to receive the output voltage OUTM of the NMOS transistor 233 via the connection 102. The nodes 224, 225 are configured to provide bias voltages to the gates of the NMOS transistors 238, 239. In some examples, the NMOS transistors 238, 239 may act as constant current sources that provide constant currents at the sources of the NMOS transistors 236, 237, which may further provide the constant currents to the nodes 201, 204 respectively.

As explained above, the nodes 222, 223 are coupled to the gates of the NMOS transistors 235, 240 and provide gate signals to NMOS transistors 235, 240, such that the transistors 235, 240 provide temperature-dependent current to the nodes 210, 212, respectively. as an output. In some examples, the temperature-dependent current may, at least in part, be inversely proportional to the temperature, such that with an increase in temperature, the temperature-dependent bias signal may decrease, i.e., NTAT current. This decrease, in turn, may decrease the current signals received at the nodes 210, 212. On the other hand, with a decrease in temperature, the temperature-dependent bias signal may increase, and that, in turn, may increase the current signals received at the nodes 210, 212.

The connections 103, 104 are coupled to the load 130. For the sake of simplicity, the load 130 is depicted as capacitors 251 and 252 coupled to nodes 207, 208 (respectively) and to ground. In some examples, the capacitors 251 and 252 may be equal. In practice, the load 130 may include the next stage in the pipeline ADC to which the voltage-gain amplifier stage 110 is coupled. The connections 103, 104 are coupled to the load 130 at the nodes 207, 208 (respectively). The drains of the NMOS transistors 236, 237 are coupled with the connections 104, 103 at the nodes 205, 206 (respectively).

In operation, as noted above, the NMOS transistors 235, 240 provide the NTAT current through nodes 222 and 223 to the nodes 205, 206, respectively, which further provide the NTAT current to the output nodes 201, 204. As noted above, the function of this NTAT current is to balance out the PTAT current provided by the node 221 to the output nodes 204, 201. Additionally, the presence of the NTAT current in the modified negative capacitance circuit 120 may result in BW(negc) being greater or equal to BW(neg) at operating temperature conditions, which may further prevent frequency peaking.

The foregoing discussion relates to NMOS transistors. However, PMOS transistors may be used in place of the NMOS transistors and the circuits 110, 120 may be readily adapted to use the PMOS transistors. In other examples, a combination of both PMOS and NMOS transistors may be used, and the circuits 110, 120 may be readily adapted to use the combination of both NMOS and PMOS transistors.

In the foregoing discussion and in the claims, the terms "including" and "comprising" are used in an open-ended fashion, and thus should be interpreted to mean "including, but not limited to . . . ." Also, the term substantially is intended to mean within 1-3% of a base value. In addition, the term "couple" or "couples" is intended to mean either an indirect or direct connection. Thus, if a first device couples to a second device, that connection may be through a direct connection or through an indirect connection via other devices and connections. Additionally, uses of the phrase "ground" in the foregoing discussion are intended to include a chassis ground, an Earth ground, a floating ground, a virtual ground, a digital ground, a common ground, and/or any other form of ground connection applicable to, or suitable for, the teachings of the present disclosure.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. A system comprising:
a voltage-gain amplifier stage comprising:
   a first transistor comprising a first gate, a first source, and a first drain;
   a second transistor comprising a second gate, a second source, and a second drain, wherein the first and the second gates are coupled to each other, and wherein the first and second drains are coupled to each other and to a first voltage supply;
   a third transistor comprising a third gate, a third source, and a third drain;
   a fourth transistor comprising a fourth gate, a fourth source, and a fourth drain, wherein the third drain is coupled to the first source at a first output node and the fourth drain is coupled to the second source at a second output node; and
   a fifth transistor having a fifth gate, a fifth source, and a fifth drain, wherein the fifth source is coupled to a ground terminal and the fifth drain is coupled to the third and the fourth sources, wherein the fifth transistor provides a first temperature-biased current; and
a negative capacitance circuit comprising:
   a constant current source;
   a sixth transistor comprising a sixth gate, a sixth source, and a sixth drain;
   a seventh transistor comprising a seventh gate, a seventh source, and a seventh drain, wherein the seventh drain is coupled to the second output node and the sixth drain is coupled to the first output node; and
   a negative capacitor coupled to the sixth and seventh sources.

2. The system of claim 1 further comprising:
an eighth transistor comprising an eighth gate, an eighth source, and an eighth drain, wherein the eighth source is coupled to the ground terminal and the eighth drain is coupled to the sixth source; and
a ninth transistor comprising a ninth gate, a ninth source, and a ninth drain, wherein the ninth source is coupled to the ground terminal and the ninth drain is coupled to the seventh source, wherein the eighth transistor provides a second temperature-biased current, wherein the ninth transistor provides a third temperature-biased current.

3. The system of claim 1, wherein the first and second gates are configured to receive a balanced differential signal.

4. The system of claim 1, wherein a bandwidth of the voltage-gain amplifier stage is less than a bandwidth of the negative capacitance circuit.

5. The system of claim 1, wherein the voltage-gain amplifier stage is coupled to a load capacitor, wherein the negative capacitor produces an effective capacitance that is less than a load capacitance generated by the load capacitor.

6. The system of claim 1, wherein the first, second, and third temperature-biased currents combine to produce substantially constant currents at the first and the second output nodes.

* * * * *